United States Patent [19]
Oh

[11] Patent Number: 5,959,904
[45] Date of Patent: Sep. 28, 1999

[54] DYNAMIC COLUMN REDUNDANCY DRIVING CIRCUIT FOR SYNCHRONOUS SEMICONDUCTOR MEMORY DEVICE

[75] Inventor: Seung-cheol Oh, Suwon, Rep. of Korea

[73] Assignee: Samsung Electronics, Co., Ltd., Suwon, Rep. of Korea

[21] Appl. No.: 08/953,351

[22] Filed: Oct. 17, 1997

[30] Foreign Application Priority Data

Oct. 18, 1996 [KR] Rep. of Korea .................. 9646851

[51] Int. Cl.⁶ .................................................. G11C 7/00
[52] U.S. Cl. ........................................ 365/200; 365/230.06
[58] Field of Search ................................ 365/200, 201, 365/194, 230.06

[56] References Cited

U.S. PATENT DOCUMENTS 5,677,882  10/1997  Isa et al. .................................. 365/200
5,703,824  12/1997  Isa ............................................ 365/200

*Primary Examiner*—Vu A. Le
*Attorney, Agent, or Firm*—Marger Johnson & McCollom, P.C.

[57] ABSTRACT

A dynamic column redundancy driving circuit for a synchronous semiconductor memory device is provided. The circuit includes a first node, a precharging portion, an address determining portion, a clock delay portion, and a driving portion. The precharging portion precharges the first node in the first phase of the clock. The address determining portion is connected to the first node and includes a plurality of fuses selectively disconnected according to a defect address and changes a logic level of the first node in the second phase of the clock according to whether an address matches the defect address. The clock delay portion delays the clock. The driving portion receives the output of the address determining portion and the output of the clock delay portion and produces a redundancy wordline driving signal.

1 Claim, 5 Drawing Sheets

DYNAMIC COLUMN REDUNDANCY DRIVING CIRCUIT FOR SYNCHRONOUS SEMICONDUCTOR MEMORY DEVICE

BACKGROUND OF THE INVENTION

The present invention relates to a semiconductor memory device including a redundancy memory cell, and more particularly, to a dynamic column redundancy driving circuit for a semiconductor memory device.

A semiconductor memory device includes a memory cell array arranged in the matrix form and is manufactured by a fabrication process of a semiconductor. However, as the memory becomes highly integrated, it is difficult to normally form all cells consisting of a semiconductor memory device due to characteristics of the fabrication process of a semiconductor. Accordingly, in order to increase the yield of the semiconductor memory device, it is required that a redundancy memory cell is formed and the redundancy memory cell is used instead of a memory cell having a defect. In the scheme using the redundancy memory cell, a coding method by a fuse is usually used. Here, processes of test and repair performed after a fabrication process of a semiconductor will be described.

In the semiconductor memory device, the predetermined number of memory cells are driven by one word line, and each word line is activated selectively according to each address applied from the outside. The word lines for driving the normal memory cells are physically fabricated such that each one corresponds to one address applied from the outside. In the redundancy word line for driving the redundancy memory cell, the address is not determined in a fabrication process, but fuse boxes programmable according to a defect address are formed in each redundancy word line. As a result of the test, when defect is found in a normal memory cell, a word line for driving the normal memory cell is disconnected and a fuse box of the redundancy word line is programmable according to the address (defect address) of the disconnected word line. The fuse box includes a plurality of fuses, where a pair of fuses are formed in per bit consisting of the address and one of each pair of fuses is selectively disconnected according to its bit information of the defect address.

The redundancy word line having the fuse box programmed by the above method is activated when an address applied from outside of a semiconductor chip matches its defect address, to thereby drive a plurality of redundancy memory cells coupled to the redundancy word line. A column redundancy driving circuit of a semiconductor memory device is to determine whether the address applied from the outside matches the defect address, to thereby drive the corresponding redundancy word line. Also, the column redundancy driving circuit is divided into a dynamic type and a static type.

FIG. 1 shows a conventional dynamic column redundancy driving circuit of a synchronous semiconductor memory device, and FIG. 2 is timing diagrams of each signal shown in FIG. 1. Referring to FIGS. 1 and 2, a node "K" is boosted to a supply voltage VCC level by a precharging portion 110 when a clock CLK is "low". When the clock CLK is "low", a PMOS transistor 111 is on, the node "K" becomes "high" and then "high" level of node "K" is inverted by an inverter 113 to be applied to a gate of the PMOS transistor 112. In an address determining portion 120, when address signals (A0, A1, ..., Ai) correspond to the defect address, the level of the node "K" is maintained in "high", otherwise, the level of the node "K" is changed to "low". In a driving portion 130, the signal of the node "K" is buffered, to thereby produce a redundancy word line driving signal REDi. The dynamic column redundancy driving circuit has a small layout area However, the node "K" should be precharged after resetting the address. That is, a time interval is required between the resetting and the precharging. This time interval serves as an obstacle for high-speed operation. Accordingly, the circuit is inappropriate to the synchronous dynamic random access memory device for high speed operation.

FIG. 3 shows another conventional static column redundancy driving circuit of a synchronous semiconductor memory device, and FIG. 4 is timing diagrams of each signal shown in FIG. 3. Referring to FIGS. 3 and 4, an address determining portion 210 includes a plurality of transmission gates 211A, 212A, ..., 213A for receiving address signals A0, A1, ..., Ai, a plurality of transmission gates 211B, 212B,..., 213B for receiving inverted address signals A0B, A1B,..., AiB, and a plurality of fuses FA0, FA1, ..., FAi and FB0, FB1, ..., FBi programmed according to the defect address. A pull-down portion 220 includes a plurality of NMOS transistors 221, 222 and 223. A driving portion 230 performs logical AND operation of logic levels of each node "L0", "L1",..., "Li" to thereby produce the redundancy word line driving signal REDi. The driving portion 230 may include multiple stages of logic gate, where a first stage includes two input NAND gates 231 and 232, a second stage includes two input-NOR gates 233 and 234, a third stage includes two input-NAND gate 235, and a fourth stage includes an inverter 236. A master fuse 250 is in a connection state in case that the corresponding redundancy memory cell replaces the defective memory cell, otherwise, the master fuse 250 is disconnected during test and repair process. When address signals A0, A1,..., Ai are applied from the outside and a driving enable signal VINT is "high", the driving enable signal VINT is inverted by an inverter 241 and a "low" level is applied to a gate of the PMOS transistor 240 and a gate of the NMOS transistor 261, to thereby turn-on the PMOS transistor 240 and turn-off the NMOS transistor 261. Accordingly, a drain of the NMOS transistor 261 becomes "high", which is inverted by an inverter 263. At this time, the node "K" becomes "low" and then each transmission gate 211A, 211B, 212A, 212B, 213A and 213B of the address determining portion 120 transmits the address signals A0, A1,..., Ai and the inverted addresses A0B, A1B,..., Ai, and the NMOS transistors 221, 222 and 223 of the pull-down portion 220 are off. An inverter 264 inverts the level of the node "K" to apply to each gate of the NMOS transistors forming each transmission gate. Accordingly, each level of the nodes L0, L1,..., Li is different based on a disconnection state of each fuse FA0, FA1,..., FAi and FB0, FBi,..., FBi. In detail, in case that the address signals A0, A1,..., Ai matches the defect address, each level of the nodes L0, L1, ..., Li is "high" and a level of the redundancy word line driving signal REDi becomes also "high". The static column redundancy driving circuit, which does not need to reset addresses or precharge a predetermined node unlike the column redundancy driving circuit shown in FIG. 1, is appropriate for operation at high speed. However, it requires a large layout area.

FIG. 5 shows still another conventional dynamic column redundancy driving circuit of a synchronous semiconductor memory device, and FIG. 6 is a timing diagram of each signal shown in FIG. 5. Referring to FIGS. 5 and 6, a precharging portion 310 includes two PMOS transistors 311 and 312 and an inverter 313, and an address determining portion 320 includes a plurality of fuses FA0, FA1, ..., FAi and FB0, FB1, ..., FBi programmed according to the defect address, a plurality of NMOS transistors 321A, 322A, 323A, 321B, 322B and 323B and a pull-down transistor 325 for receiving address signals A0, A1,. . . , Ai and inverted addresses A0B, A1B,. . . , AiB. A discharge portion 330 includes an inverter 312 and a NMOS transistor 331. When an enable signal VINT is "low", the output of the inverter 312 becomes "high", and the NMOS transistor 331 is on. When the NMOS transistor 331 is on, the level of the node "K" is "low". A latch portion 340 includes two inverters 341 and 342, and an inverter 350 drives the output of the latch portion 340. Also, a transmission gate 360 including a PMOS transistor 361, a NMOS transistor 362 and an inverter 363 is on when the clock CLK is "high", to thereby transmit the output of the node "K" to a node "K1".

However, in the dynamic column redundancy driving circuit shown in FIG. 5, the node "K1" should be discharged before the transmission gate 360 is on to transmit a signal of the node "K" to the latch portion 340. In case that the transmission gate 360 is on before the node "K1" is sufficiently discharged, skew occurs to generate malfunction. Also, the transmission gate 360, the discharge portion 330 and the latch portion 340 are included, to thereby increase the layout area, and further signal delay may occur due to the transmission gate 360 controlled by the clock CLK.

SUMMARY OF THE INVENTION

Accordingly, it is an object of the present invention to provide a dynamic column redundancy driving circuit of a synchronous semiconductor memory device for preventing skew.

It is another object of the present invention to provide a dynamic column redundancy driving circuit of a synchronous semiconductor memory device capable of operating at high speed and for reducing a layout area.

To accomplish the above object of the present invention, there is provided a dynamic column redundancy driving circuit of a synchronous semiconductor memory device comprising a first node, a precharging portion, an address determining portion, a clock delay portion, and a driving portion. The precharging portion precharges the first node in the first phase of the clock. The address determining portion is connected to the first node and includes a plurality of fuses selectively disconnected according to a defect address and changes a logic level of the first node in the second phase of the clock according to whether an address matches the defect address. The clock delay portion delays the clock. The driving portion receives the output of the address determining portion and the output of the clock delay portion and produces a redundancy wordline driving signal.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
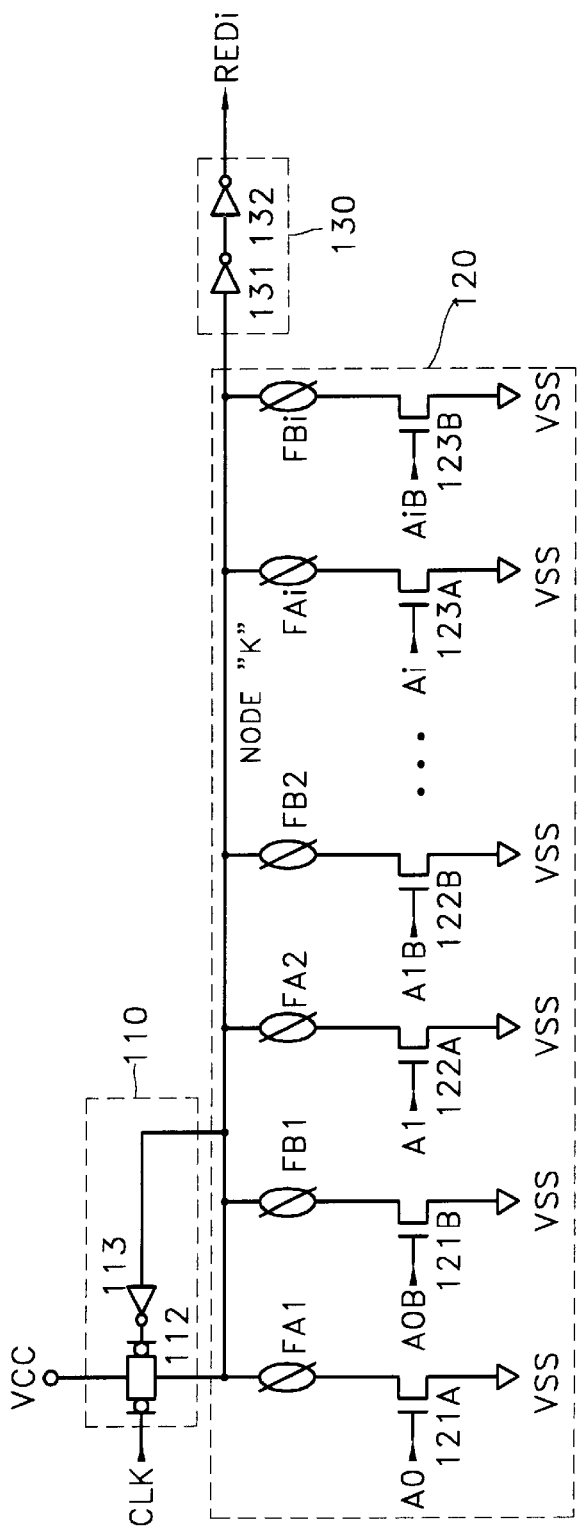
FIG. 1 is a conventional dynamic column redundancy driving circuit of a synchronous semiconductor memory device.
Figure 2:
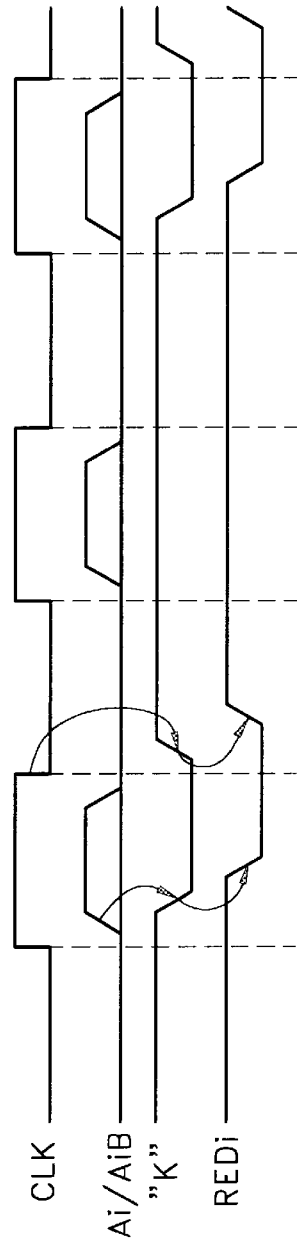
FIG. 2 is a timing diagram of each signal shown in FIG. 1.
Figure 3:
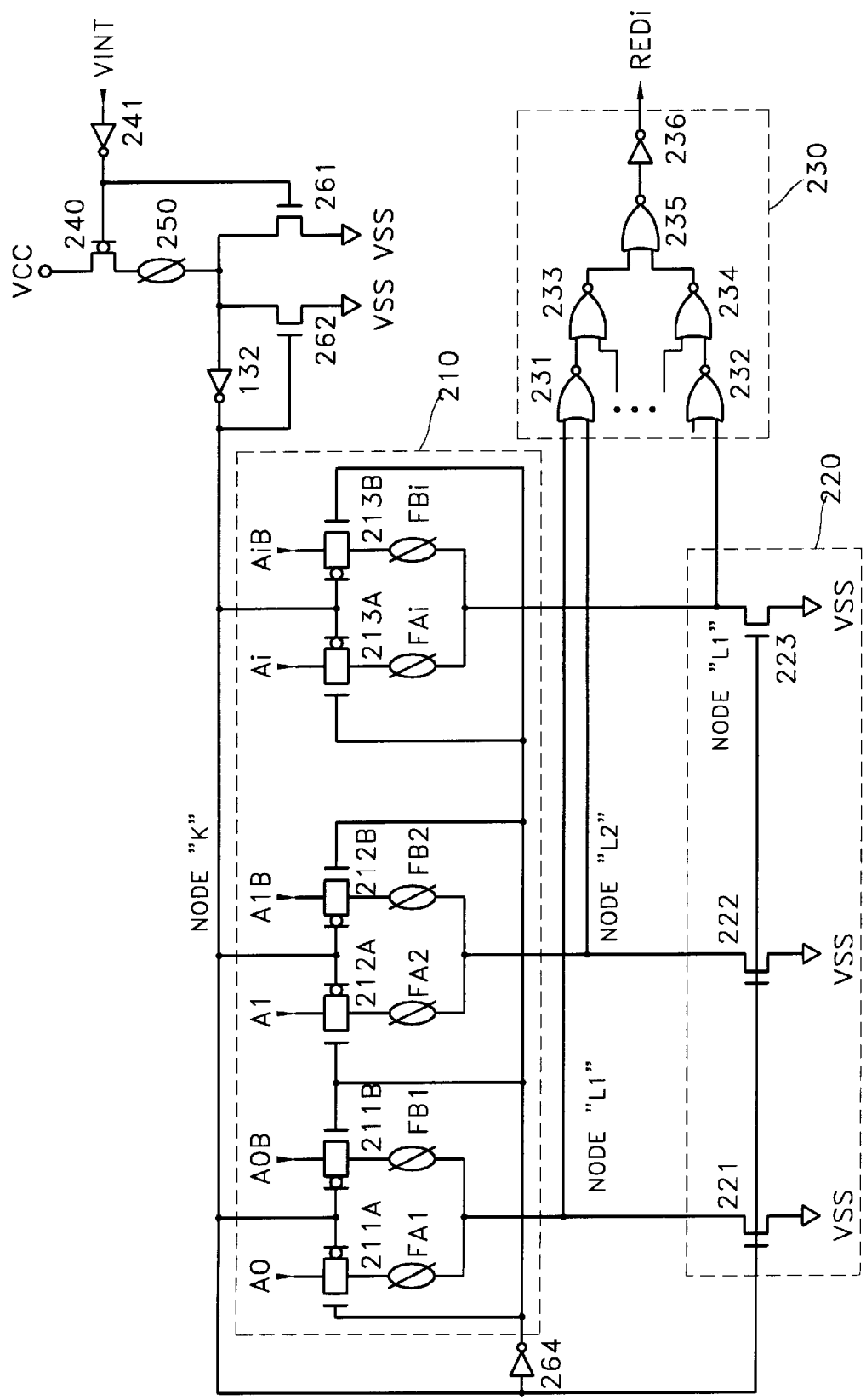
FIG. 3 is another conventional static column redundancy driving circuit of a synchronous semiconductor memory device.
Figure 4:
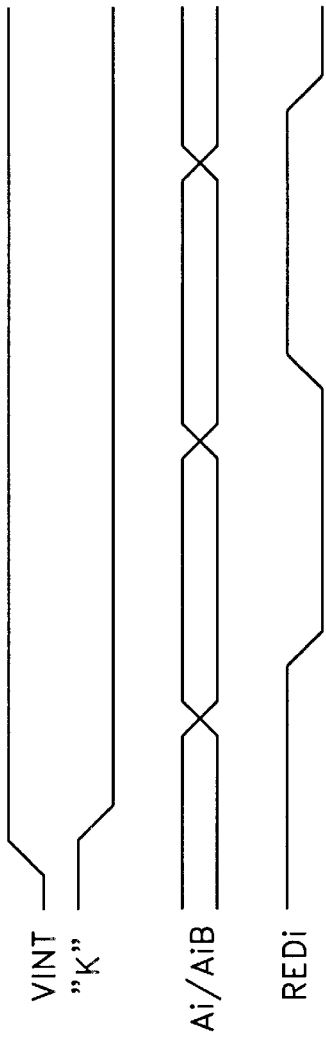
FIG. 4 is a timing diagram of each signal shown in FIG. 2.
Figure 5:
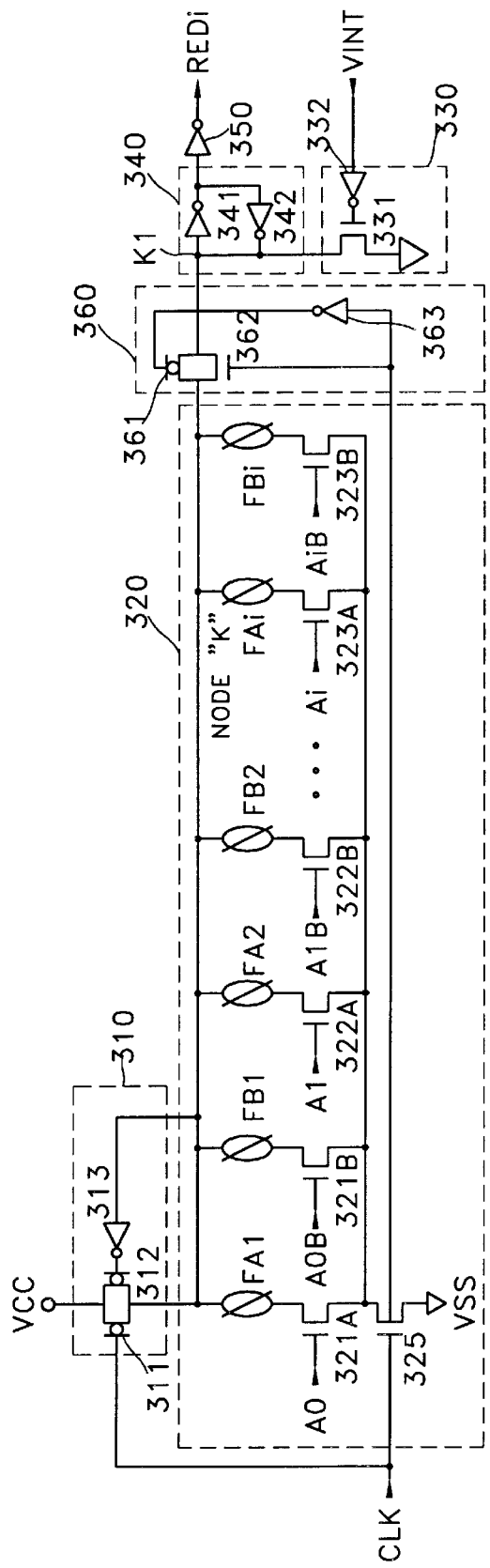
FIG. 5 is still another conventional dynamic column redundancy driving circuit of a conventional synchronous semiconductor memory device.
Figure 6:
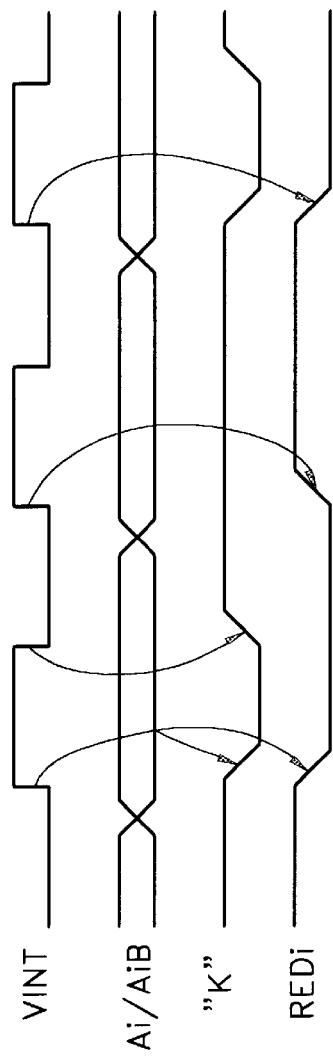
FIG. 6 is a timing diagram of each signal shown in FIG. 5.
Figure 7:
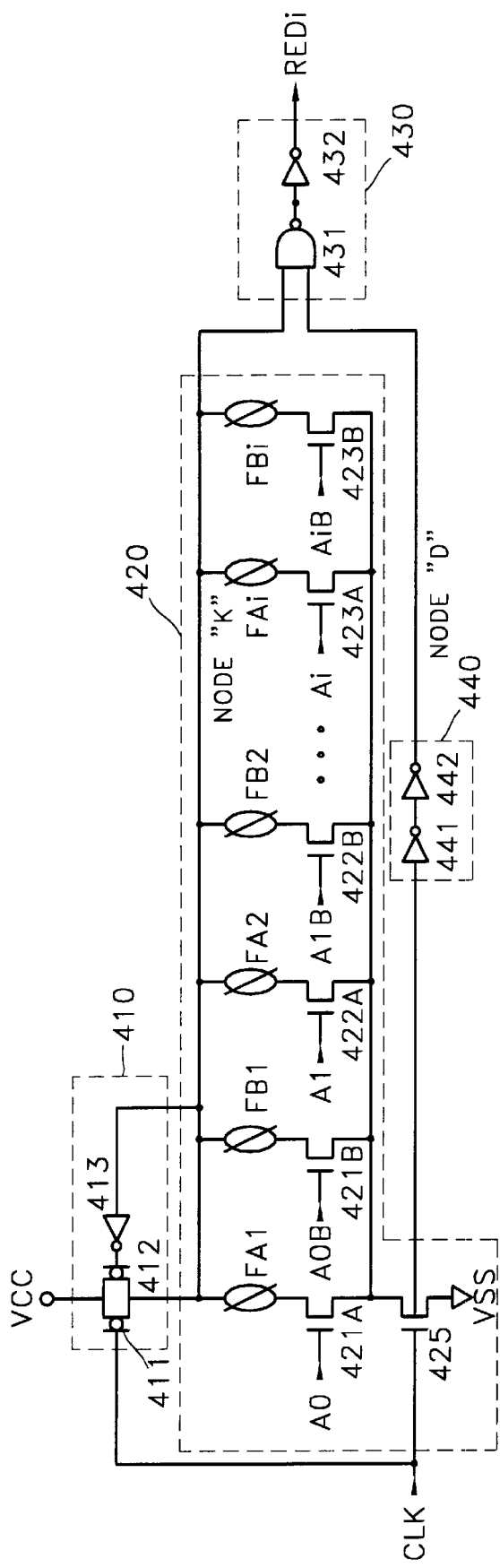
FIG. 7 is a dynamic column redundancy driving circuit of a synchronous semiconductor memory device according to the present invention.
Figure 8:
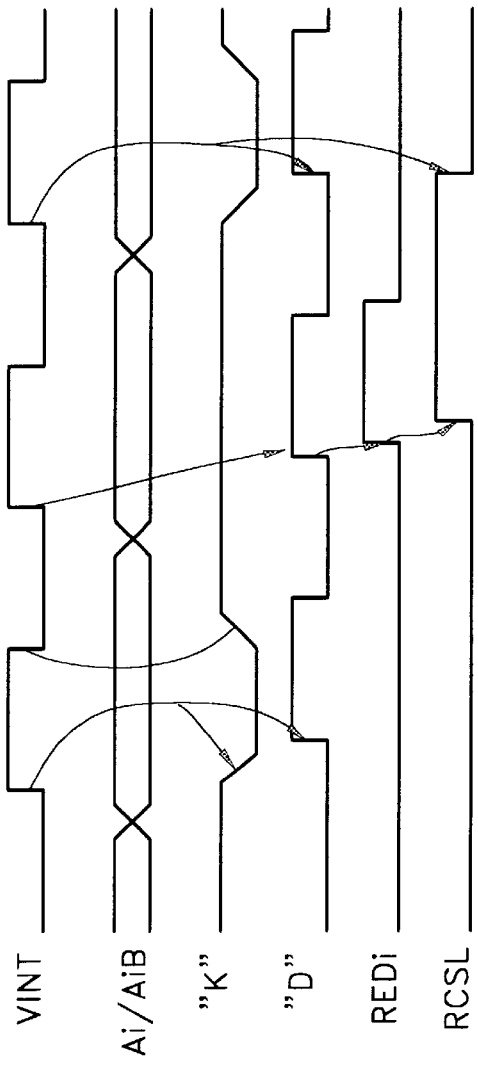
FIG. 8 is a timing diagram of each signal shown in FIG. 7.

Referring to FIGS. 7 and 8, a dynamic column redundancy driving circuit includes a precharging portion 410, an address determining portion 420, a driving portion 430 and a clock delay portion 440. The precharging portion 410 includes two PMOS transistors 411 and 412 and an inverter 413, and boosts a voltage of node "K" to supply voltage VCC in case that the clock CLK is low. The address determining portion 420 includes a plurality of fuses FAO, FA1,. . . FAi and FB0, FB1,. . . , FBi, a plurality of NMOS transistors 421A, 421B, 422A, 422B,. . . , 423A and 423B and a pull-down transistors 425. One fuse and one NMOS transistor are connected in series between the node "K" and the pull-down transistor 425, and the address signals A0, A1,. . . , Ai and the inverted addresses AOB, A1B,. . . , AiB is applied to the gates of the NMOS transistors, respectively. A pair of fuses correspond to one bit of address, where each fuse has been already programmed according to a defect address detected during test process. By a method for programming an address to the fuse, as described above, a pair of fuses are selectively disconnected according to each bit data of the defect address. For example, in case that the defect address is 010, the fuse FB0 of fuses FA0 and FB0 corresponding to a first bit is disconnected, and the fuse FA1 of fuses FA1 and FB1 corresponding to a second bit is disconnected, and the fuse FB2 of fuses FA2 and FB2 corresponding to a third bit is disconnected. A fuse array is programmed according to the defect address, and the address signals A0, A1,. . . , Ai and the inverted address signals A0B, A1B,. . . , AiB are applied to the gates of NMOS transistors connected in series to each fuse, respectively. A plurality of paths exist between the node "K" and the pull-down transistor 425, where each path includes one fuse and one NMOS transistor controlled by each bit signal of the address signals A0, A1, . . . , Ai and the inverted address signals A0B, A1B,, AiB. In the address determining portion 420, in case that the address signals A0, A1,. . . Ai and the inverted address signals A0B, A1B,. . . ,AiB match the defect address, none of the paths for connecting the node "K" to the pull-down transistor 425 is on. Accordingly, the node "K" is maintained in a precharged state, i.e., a "high" level. However, in case that the address signals A0, A1,. . . Ai and the inverted address signals A0B, A1B,. . . ,AiB do not match the defect address, at least one or more current paths are on. Accordingly, the level of the node "K" becomes "low". The pull-down transistor 425 is on in case that the clock CLK is "high". Accordingly, the address determining result can be represented by a level of the node "K" in case that the clock CLK is "high". In case that the level of the node "K" is transited to "low" since the address does not match the defect address, discharge time T is required as shown in FIG. 8. Accordingly, when a signal of the node "K" is detected before the node "K" is sufficiently discharged, malfunction is generated. The clock delay portion 440 may include inverters 441 and 442. The clock delay portion 440 delays and buffers the clock signal CLK and the output of clock delay portion 440 is applied to the driving portion 430. In an embodiment shown in FIG. 7, the driving portion 430 includes a NAND gate 431 for receiving the output of the clock delay portion 440 and the signal of the node "K" and an inverter for inverting the output of the NAND gate 431. In FIG. 8, CLK represents a clock signal, Ai/AiB represents the address and the inverted address signal, reference character "D" represents the output of the clock delay portion 440, REDi represents a redundancy word line driving signal, and RCSL represents a redundancy column selection signal.

Figure 9:
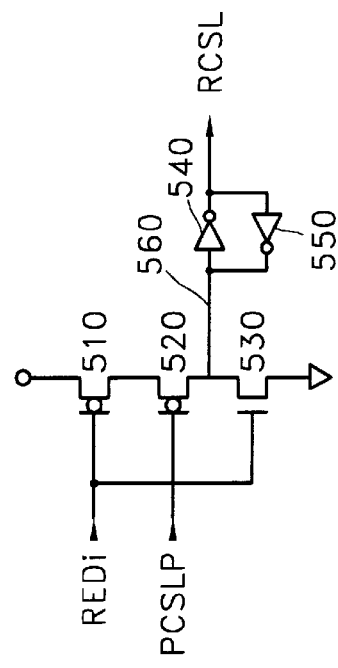
FIG. 9 is a circuit diagram showing a redundancy column selection signal generation portion related to a dynamic column redundancy driving circuit of a synchronous semiconductor memory device according to the present invention.

Referring to FIG. 9, a redundancy column selection signal generation portion includes two PMOS transistors 510 and 520, a NMOS transistor 530 and a latch portion, where the latch portion includes two inverters 540 and 550. A PCSLP signal of a column selection line precharge signal, in which the clock is delayed by a predetermined period of time and inverted, is applied to a gate of the PMOS transistor 520. The redundancy word line driving signal REDi is applied to a gate of the PMOS transistor 510 and a gate of the NMOS transistor 530. Accordingly, when the redundancy word line driving signal REDi is "low" and the PCSLP signal is "low", a level of the node 560 becomes "high" and a level of the redundancy column selection signal RSCL becomes "low". The circuit is provided to an output terminal of the column redundancy driving circuit shown in FIG. 7, to thereby drive a corresponding word line.

According to the above-described dynamic column redundancy driving circuit of a synchronous semiconductor memory device, it is possible to prevent skew, which can be generated in case that the first node K is precharged and then is transited to a "low" level, which is caused by discordance of address applied from outside with the defect address. Also, it is possible to operate at high speed and further to reduce an area required for layout in realizing a semiconductor chip.

What is claimed is:

1. A dynamic column redundancy driving circuit for a synchronous semiconductor memory device operated in synchronization with a clock, said circuit comprising:

a first node;

a precharging portion for precharging said first node in the first phase of said clock;

an address determining portion connected to said first node and including a plurality of fuses selectively disconnected according to a defect address and for changing a logic level of said first node in the second phase of said clock according to whether an address matches the defect address;

a clock delay portion for delaying said clock;

a driving portion for receiving the output of said address determining portion and the output of said clock delay portion for producing a redundancy enable signal; and a redundancy column selection signal generation portion including:

a first PMOS transistor for receiving said redundancy enable signal at its gate;

a second PMOS transistor for receiving a column selection precharge signal at its gate;

a first NMOS transistor for receiving said redundancy enable signal at its gate; and a latch portion for latching the output out of the drain of said first NMOS transistor, wherein said first and second PMOS transistors are connected in series between a supply voltage terminal and the drain of said first NMOS transistor having a source connected to ground.

* * * * *